(12) United States Patent
Kim et al.

(10) Patent No.: US 6,703,124 B2
(45) Date of Patent: Mar. 9, 2004

(54) EPOXY RESIN COMPOSITION AND LAMINATE USING THE SAME

(75) Inventors: Young-Sik Kim, Seoul (KR); Hyun-Cheol Kim, Daejeon (KR); Dong-Rak Shin, Cheongju (KR)

(73) Assignee: LG Chemical Co., Ltd., Seoul (KR)

( * ) Notice: Subject to any disclaimer, the term of this patent is extended or adjusted under 35 U.S.C. 154(b) by 8 days.

(21) Appl. No.: 10/049,117

(22) PCT Filed: Jun. 8, 2001

(86) PCT No.: PCT/KR01/00979
§ 371 (c)(1),
(2), (4) Date: Feb. 8, 2002

(87) PCT Pub. No.: WO01/96440
PCT Pub. Date: Dec. 20, 2001

(65) Prior Publication Data
US 2003/0054146 A1 Mar. 20, 2003

(30) Foreign Application Priority Data
Jun. 10, 2000 (KR) ......................................... 2000-31965

(51) Int. Cl.⁷ ............................................... D02G 31/00
(52) U.S. Cl. ....................... 428/375; 428/361; 428/366; 428/378; 428/292.1; 525/506; 528/91
(58) Field of Search .............................. 428/292.1, 361, 428/366, 375, 378, 388; 523/445; 525/505, 506, 523, 504; 528/88, 91, 92

(56) References Cited

U.S. PATENT DOCUMENTS

| 5,308,895 A | * | 5/1994 | Gan et al. ..................... 523/445 |
| 5,508,328 A | | 4/1996 | Olson ......................... 523/445 |
| 5,721,323 A | | 2/1998 | Schultz et al. ............... 525/504 |

FOREIGN PATENT DOCUMENTS

| CN | 1164244 A | 11/1997 |
| EP | 0517337 A2 | 12/1992 |
| JP | 09059351 | 3/1997 |
| JP | 10087964 | 4/1998 |

* cited by examiner

Primary Examiner—Merrick Dixon
(74) Attorney, Agent, or Firm—Baker Botts L.L.P.

(57) ABSTRACT

The present invention relates to a nonflammable epoxy resin composition for using a thin copper film laminate, which is applied to a printed circuit board (PCB), and using the same. The present invention provides for nonflammable epoxy resin composition for using a thin copper film laminate, comprising bisphenol A-type epoxy resin, multifunctional epoxy resin, an imidazole-based curing catalyst, and a curing retarder, and using the same. As described above, since the ring-open of the epoxy group is prompted by an imidazole catalyst, without the use of dicyandiamide, epoxy polymer reaction occurs due to the chain-reaction of epoxy group, and the glass-transition temperature is 170° C. or greater, the nonflammable epoxy resin composition for using a thin copper film of the present invention has a strong heat-resistance, lower dielectric constant, controllable gelation time, and does not require the use of non-harmful catalysts to the human body.

8 Claims, No Drawings

EPOXY RESIN COMPOSITION AND LAMINATE USING THE SAME

CROSS REFERENCE TO RELATED APPLICATION

This application is based on application No. 2000-0031965 filed with the Korean Industrial Property Office on Jun. 10, 2000, the content of which is incorporated hereinto by reference.

BACKGROUND OF THE INVENTION (a) Field of the Invention

The present invention relates to an epoxy resin composition for using a nonflammable thin copper film laminate, which is applied to a printed circuit board (PCB), and a laminate using the same.

(b) Description of the Related Art

In conventional epoxy resin composition, an amine-based curing agent and a curing prompter have been generally used as well as brominated difunctional and multifunctional epoxy resins as the main material. The brominated epoxy resin has been used to bring non-flammability, and trifunctional or multifunctional epoxy resin has been also used to increase heat-resistance and mechanical strength. However, since the cure reaction does not occur easily with the use of only epoxy resin, the epoxy resin may be cured by adding a curing agent into the epoxy resin, and activating the epoxy group.

At present, dicyandiamide has been generally used as a curing agent, however imidazole is generally added as a curing catalyst, since the reaction rate of dicyandiamide with epoxy resin is very slow, in the case where the dicyandiamide is only used. U.S. Pat. Nos. 5,308,895, 5,508,328, 5,620,789, and 5,721,323 show that boric acid is added as a cure retarder in order to increase a glass-transition temperature, by controlling a curing rate and increasing a curing degree due to increase to a curing density. However, dicyandiamide is used as a curing agent, and the glass-transition temperature (Tg) is between 140° C. and 160° C.

Since a coordinate bond with the boric acid and the imidazole at low temperatures prevents the imidazole from curing the epoxy resin, the epoxy resin has an improved stability at room temperature, and the coordinate bond inhibits curing the epoxy resin at low temperatures. In general, the boric acid and imidazole decompose with each other at 120° C. or greater, the decomposing imidazole improves the reactivity of dicyandiamide, and a ring-open of epoxy group is prompted due to the increase in reactivity. As a result, the curing rate of the epoxy resin increases, and then the glass-transition temperature increases.

However, the use of dicyandiamide requires organic solvents such as dimethylformamide (DMF), and N-methyl 2-pyrrolidone, which are harmful to the human body, due to the solubility of dicyandiamide, and also requires stable storage, since the dicyandiamide deposits at low temperatures. As well, heat-resistance of the epoxy resin and the dicyandiamide is limited at 250° C. or above, since the dicyandiamide is pyrolyzed by itself at 200° C. or above. In addition, there is an increase in the dielectric constant of the epoxy resin, that results from adding dicyandiamide.

Accordingly, in the case where imidazole prompts the ring-open of the epoxy resin without the use of dicyandiamide, and epoxy polymer reaction occurs through the chain-reaction of the epoxy group, a thin copper film laminate that has a glass-transition temperature in the range of 170° C. or greater and improved heat-resistance may be fabricated, since the polymer bond gets to be strong, the curing density can increase. In addition, the thin copper film laminate has decreased dielectric constant than the conventional one. However, the epoxy resin composition for the thin copper film laminate, as mentioned above, has not appeared.

The heat-resistance of nonflammable epoxy resin for using thin copper film laminate is represented by the glass-transition temperature, and the epoxy resin having a glass-transition temperature in the range of 120° C. to 150° C. has been generally used as a FR-4 product. As the glass-transition temperature is higher, the epoxy resin has a better heat-resistance due to the high curing density of epoxy resin, a suitable size at high temperatures due to small heat expansion, lower absorbability to water due to dense molecular structure. Therefore, a thin copper film laminate may be manufactured, compared to a polymer resin having low glass-transition temperature. In order to increase the glass-transition temperature, certain methods have been applied where epoxy resin having a trifunctional group or a multifunctional group is added, novolac epoxy is added, and BT resin or polyimide is blended.

SUMMARY OF THE INVENTION

The present invention is made in consideration of the problems of the prior art, and it is an object of the present invention to provide a nonflammable epoxy resin composition for a thin copper film laminate, having an improved heat-resistance due to the increase to a glass-transition temperature of 170° C. or greater, which results from an epoxy polymer reaction that is prompted to a ring-open of epoxy group by imidazole without use of dicyandiamide.

It is another object to provide the nonflammable epoxy resin composition for a copper thin film laminate, having low dielectric constant, and a laminate using the same.

It is another object to provide the nonflammable epoxy resin composition for a copper film laminate, that is prepared without use of a harmful solvent to human body, and a laminate using the same.

It is another object to provide the nonflammable epoxy resin composition having a controllable gelation time through controlling a curing rate of epoxy resin and a laminate using the same.

In order to achieve these objects, the present invention provides a nonflammable epoxy resin composition for using a thin copper film laminate comprising:

a) brominated bis-phenol A-type difunctional epoxy resin;

b) multifunctional epoxy resin;

c) an imidazole-based curing catalyst; and d) a curing retarder.

The present invention also provides a thin copper film laminate, that comprises a fiber glass laminate impregnated with one or more epoxy resins, and the thin copper film located on the outer of the fiber glass laminate, wherein the fiber glass laminate and the thin copper film are united with each other.

DETAILED DESCRIPTION OF THE PREFERRED INVENTION

In the following detailed description, only the preferred embodiment of the invention has been shown and described, simply by way of illustration of the best mode contemplated by the inventors of carrying out the invention. As will be realized, the invention is capable of modification in various obvious respects, all without departing from the invention. Accordingly, the description is to be regarded as illustrative in nature, and not restrictive.

The epoxy resin composition of the present invention, which is used for a thin copper film laminate of a nonflammable impregnated fiber glass laminate, is cured by imidazole catalyst, due to a ring-open of epoxy group, instead of the conventional dicyandiamide.

The bis-phenol A-type epoxy resin of the present invention comprises bromine, that is preferably from 15 wt % to 55 wt %, and the bromine brings non-flammability into a thin copper film laminate, and the equivalent ratio of epoxy group is preferably from 300 to 1500.

In addition, the multifunctional epoxy resin of the present invention has three or more epoxy functional groups per molecule, that is trifunctional, and tetrafunctional and novolac resin as a general multifunctional epoxy resin. In general, as the functional groups increase, the epoxy resin has greater glass-transition temperature.

The epoxy resin needs a curing agent in curing process, and an amine-based curing agent has been used as a conventional curing agent, that has a problem on solubility to an organic solvent, and requires sophisticated processes. Accordingly, as supplement to the conventional curing agent, the curing agent of the present invention includes imidazoles, such as 1-methyl imidazole, 2-methyl imidazole, 2-ethyl 4-methyl imidazole, 2-phenyl imidazole, 2-cyclohexyl 4-methyl imidazole, 4-butyl 5-ethyl imidazole, 2-methyl 5-ethyl imidazole, 2-octhyl 4-hexyl imidazole, 2,5-choloro-4-ehtyl imidazole, and 2-butoxy 4-allyl imidazole, and imidazole derivatives.

The content of the imidazoles is preferably based on 0.1 to 20 weight part, compared to 100 weight part of epoxy resin (the total weight of difunctional epoxy resin and multifunctional epoxy resin), and more preferably based on 1 to 5 weight part.

The use of imidazoles increases the gelation rate of epoxy resin, and epoxy resin is uneasy to mold, since the gelation time is shorter to 200 seconds or less. Therefore, a curing retarder is used in order to control the gelation rate, and increase the gelation time to 200 seconds or more, and the curing retarder brings convenience to mold. The curing retarder includes boric acid, salicylic acid, hydrochloric acid, sulfuric acid, oxalic acid, terephthalic acid, isophthalic acid, phosphoric acid, lactic acid, phenyboric acid, and toluene sulfuric acid, and the amount of the curing retarder used is preferably from 0.1 to 10 equivalent weight per mole based on equivalent weight per mole of imidazole, more preferably from 0.5 to 5 equivalent weight per mole of imidazole.

Though the epoxy resin of the present invention may be used with multifunctional epoxy resin in small amounts, the present invention has glass-transition temperature in the range of 170° C. or greater, since the curing rate and curing density of epoxy resin are controlled by adding the imidazole, respectively as a catalyst, and a curing retarder. Therefore, it can manufacture nonflammable thin copper film laminate having strong heat-resistance. In addition, the use of imidazole may not need the use of an amine-based curing agent such as dicyandiamide, which has a low solubility to an organic solvent, and an undesirable property at high temperatures, and also may not need the use of a harmful solvent to the human body such as DMF on the curing process. Therefore, the process may be environmentally desirable, and the dielectric constant may decrease.

While the present invention has been described in detail with reference to the preferred embodiments, those skilled in the art will appreciate that various modifications and substitutions can be made thereto without departing from the spirit and scope of the present invention as set forth in the appended claims.

EXAMPLES

Example 1
(Preparation for Epoxy Resin Composition)

According to the composition shown in Table 1, an epoxy resin composition was prepared.

At first, 2.0 g of 2-phenyl imidazole and 0.85 g of boric acid were added into 500 ml beaker, and then the mixture was completely dissolved after adding 25 g of methylcellosolve (MCS: ethylene glycol monomethyl ether) thereinto.

After 125 g of a brominated bis-phenol A-type epoxy resin (prepared by LG Chem, LER-1222M80) as a difunctional epoxy resin of which equivalent weight is 450, was added into the solution, the solution was stirred until completely mixed.

In addition, 50 g of tetrafunctional epoxy resin (manufactured by Shell Corp., EPON 1030), which was completely dissolved in 50 g of MCS, was added the solution, and then was stirred until completely mixed.

The gelation time of the epoxy resin composition was measured by a hot plate having the temperature of 170° C., the gelation time was 210 seconds.

(Manufacture of Thin Copper Film Laminate)

The prepared epoxy resin composition was impregnated with fiberglass (fabricated by Nittobo Corp., product No.7628), and fiberglass prepreg, of which the content of epoxy resin is 43 wt %, was prepared by hot-air-drying.

After 8 sheets of the fiberglass prepreg was laminated, 35 $\mu$m of copper films were further laminated on and below the prepreg, and the laminated films were heated and pressed for 90 minutes at 185° C. under 40 kg/cm$^1$, then 1.6 mm of copper film laminate in thickness was finally prepared.

(Test for Thin Copper Film Laminate)

The thin copper film was removed from thin copper film laminate by etching, and glass-transition temperature of the film was 177° C. by measuring with DSC (differential scanning calorimeter).

Lead-resistance was measured by placing a sample that was cut with the size of 5 cm by 5 cm and the thickness of 1.6 mm under a lead-furnace, and measuring the bearing time of the sample.

Heat-resistance in an oven was measured by placing a sample that was cut with the size of 5 cm by 5 cm and the thickness of 1.6 mm under an oven having constant temperature of 270° C., and measuring the bearing time of the sample.

In order to verify change of dielectric constant of a product removed dicyandiamide, a thin copper film laminate was manufactured in the same way as described above, fiber glass was changed into product No. 2116, and a product having 0.5 mm in thickness was manufactured, finally the dielectric constant of the product was measured according to JIS C 6481. The results are shown in Table 1.

Comparative Example 1
(Preparation for Epoxy Resin Composition with Use of Dicyandiamide)

An epoxy resin composition was prepared with use of dicyandiamide as a curing agent, which was generally used for preparing FR-4, according to the composition shown in Table 1.

2.0 g of 2-phenyl imidazole and 5.60 g of dicyandiamide were added in 500 ml beaker, and then the mixture was completely dissolved after adding 45 g of methylcellosolve (MCS: ethylene glycol monomethyl ether) and 10 g of DMF thereinto.

After 125 g of a brominated bis-phenol A-type epoxy resin (prepared by LG Chem, LER-1222M80) as a difunctional epoxy resin of which equivalent weight is 450, was added into the solution, the solution was stirred until completely mixed.

In addition, 50 g of tetrafunctional epoxy resin (manufactured by Shell Corp., EPON 1030), which was completely dissolved in 50 g of MCS, was added to the solution, and then was stirred until completely mixed.

The gelation time of the epoxy resin composition was measured by a hot plate having the temperature of 170° C., the gelation time was 250 seconds.

In the same way according to Example 1.6 mm copper film laminate was manufactured, and glass transition temperature, lead-resistance, and heat-resistance in an oven of the thin copper film laminate was also measured.

In addition, in the same way according to Example 1, 0.5 mm product in thickness was manufactured and dielectric constant was measured. The test results are shown in Table 1.

Comparative Example 2 and 3

In the same way according to Example 1, glass-transition temperature, lead-resistance, and heat-resistance in an oven of conventional FR-4 and FR-5 were measured, and the test results are shown in Table 1.

TABLE 1

| | Kind | Example 1 | Comparative Example 1 | Comparative Example 2 (FR-4) | Comparative Example 3 (FR-5) |
|---|---|---|---|---|---|
| Epoxy Resin Composition (phr) | Difunctional Epoxy Resin (LER1222M80) | 125 | 125 | — | — |
| | Tetrafunctional Epoxy Resin (EPON-1030) | 50 | 50 | | |
| | Imidazoles (2-phenyl imidazole) | 2.0 | 0.2 | | |
| | Dicyandiamide | — | 5.60 | | |
| | Curing retarder (boric acid) | 0.85 | — | | |
| Properties | Gelation time (sec) | 210 | 250 | — | — |
| | Glass-transition temperature (° C.) | 177 | 158 | 125 | 175 |
| | Lead resistance (sec) | 900 or longer | 305 | 300 | 618 |
| | Heat-resistance in an oven (sec) | 1200 or longer | 605 | 585 | 715 |
| | Dielectric constant | 4.4~4.5 | 4.7~4.8 | — | — |

Example 2~5

As shown in Table 2 below, the contents of imidazole and curing retarder were changed, and in the same way according to the above Example 1, epoxy resin composition was prepared and a thin copper film laminate was manufactured. The properties are shown in Table 2.

TABLE 2

| | Kind | Example 2 | Example 3 | Example 4 | Example 5 |
|---|---|---|---|---|---|
| Epoxy Resin Composition (phr) | Difunctional epoxsy resin (LER1222M80) | 125 | 125 | 125 | 125 |
| | Tetrafunctional Epoxy resin (EPON-1031) | 50 | 50 | 50 | 50 |
| | Imidazoles (2-phenyl imidazole) | 1.0 | 1.5 | 2.0 | 2.5 |
| | Curing retarder (boric acid) | 0.44 | 0.64 | 0.85 | 1.05 |
| Properties | Gelation time (sec) | 366 | 230 | 210 | 149 |
| | Glass-transition temperature (° C.) | 164 | 172 | 180 | 185 |

According to the test results, as the content of imidazole increases, gelation time decreases due to the increase of the gelation time of the epoxy resin, however, after mold, the glass-transition temperature of the thin copper film laminate increases due to the increase in the curing density.

Example 6~9

As shown in Table 3 below, the content of imidazole was changed, and in the same way according to the above Example 1, epoxy resin composition was prepared, and a thin copper film laminate was manufactured. The properties are shown in Table 3.

TABLE 3

| | Kind | Example 6 | Example 7 | Example 8 | Example 9 |
|---|---|---|---|---|---|
| Epoxy Resin Composition | Difunctional epoxy resin | 125 | 125 | 125 | 125 |

TABLE 3-continued

| | Kind | Example 6 | Example 7 | Example 8 | Example 9 |
|---|---|---|---|---|---|
| (phr) | (LER1222M80) Tetrafunctional Epoxy resin (EPON-1031) | 50 | 50 | 50 | 50 |
| | Imidazoles (2-phenyl imidazole) | 2.0 | 2.0 | 2.0 | 2.0 |
| | Curing retarder (boric acid) | 0.64 | 0.83 | 1.09 | 1.30 |
| Properties | Gelation time (sec) | 230 | 250 | 250 | 205 |
| | Glass-transition temperature (° C.) | 172 | 175 | 176 | 173 |

The desired gelation time was measured by controlling the content of imidazole and boric acid, respectively used as a curing agent and a curing retarder, and the glass-transition temperature increased to 170° C. or greater.

As described above, since the ring-open of the epoxy group is prompted by an imidazole catalyst, without use of dicyandiamide, epoxy polymer reaction occurs due to the chain-reaction of epoxy group, and the glass-transition temperature is 170° C. or greater, the nonflammable epoxy resin composition for using a thin copper film laminate of the present invention has a strong heat-resistance, lower dielectric constant, controllable gelation time, and does not require the use of non-harmful catalysts to the human body.

What is claimed is:

1. A nonflammable epoxy resin composition for a thin copper film laminate, which comprises:
   a) brominated bis-phenol A-type difunctional epoxy resin;
   b) multifunctional epoxy resin;
   c) an imidazole-based catalyst; and
   d) a curing retarder,
   wherein the composition is substantially free of dicyandiamide, and has a glass transition temperature of 170° C. or more.

2. The epoxy resin composition according to claim 1, wherein the difunctional epoxy resin of a) has bromine of which content is from 15 to 55 wt %.

3. The epoxy resin composition according to claim 1, wherein the multifunctional epoxy resin of b) selected from a group of epoxy resin consisting of trifunctional epoxy, tetrafunctional epoxy, novolac resin and a mixture thereof.

4. The epoxy resin composition according to claim 1, wherein the imidazole catalyst for a curing reaction of c) selected from a group consisting of 1-methyl imidazole, 2-methyl imidazole, 2-ethyl 4-methyl imidazole, 2-phenyl imidazole, 2-dyclohexyl 4-methyl imidazole, 4-butyl 5-ethyl imidazole, 2-methyl 5-ethyl imidazole, 2-octyl 4-hexyl imidazole, 2,5-choloro-4ehtyl imidazole, 2-butoxy 4-allyl imidazole, and a mixture thereof.

5. The epoxy resin composition according to claim 1, wherein the content of the imidazole catalyst of c) is based on 0.1 to 20 weight part, compared to epoxy resin based on 100 weight part.

6. The epoxy resin composition according to claim 1, wherein the curing retarder of d) selected from a group consisting of boric acid, salicylic acid, hydrochloric acid, sulfuric acid, oxalic acid, terephthalic acid, isophthalic acid, phosphoric acid, lactic acid, phenyboric acid, toluene sulfuric acid, and mixture thereof.

7. The epoxy resin composition according to claim 1, wherein the content of the curing retarder of d) is from 0.1 to 10 equivalent weight, compared to the equivalent weight of imidazole catalyst.

8. A thin copper film laminate, which comprises a fiber glass laminate impregnated with one or more epoxy resin compositions, and a copper film located on the outside of the glass fiber laminate, wherein the fiber glass laminate and the copper film is united with each other through heating and pressing, wherein the epoxy resin composition comprises:
   a) brominated bis-phenol A-type difunctional epoxy resin;
   b) multifunctional epoxy resin;
   c) an imidazole-based catalyst; and
   d) a curing retarder,
and it is substantially free of dicyandiamide, and has a glass transition temperature of 170° C. or more.

* * * * *